United States Patent
Busse et al.

(10) Patent No.: US 9,553,249 B2
(45) Date of Patent: Jan. 24, 2017

(54) METHOD FOR PRODUCING THERMOELECTRIC COMPONENTS BY POWDER METALLURGY

(71) Applicant: Evonik Degussa GmbH, Essen (DE)

(72) Inventors: Jens Busse, Bochum (DE); Sascha Hoch, Bochum (DE); Magdalena Kern, Alzenau (DE); Mareike Giesseler, Hanau (DE); Thorsten Schultz, Hassenroth (DE); Patrik Stenner, Hanau (DE); Paw V. Mortensen, Hjørring (DK); Ali Asghar Enkeshafi, Aalborg (DK)

(73) Assignee: Evonik Degussa GmbH, Essen (DE)

( * ) Notice: Subject to any disclaimer, the term of this patent is extended or adjusted under 35 U.S.C. 154(b) by 0 days.

(21) Appl. No.: 15/025,162

(22) PCT Filed: Aug. 14, 2014

(86) PCT No.: PCT/EP2014/067387
§ 371 (c)(1),
(2) Date: Mar. 25, 2016

(87) PCT Pub. No.: WO2015/043824
PCT Pub. Date: Apr. 2, 2015

(65) Prior Publication Data
US 2016/0240763 A1 Aug. 18, 2016

(30) Foreign Application Priority Data
Sep. 27, 2013 (DE) .................. 10 2013 219 541

(51) Int. Cl.
*H01L 35/34* (2006.01)
*H01L 35/16* (2006.01)
(Continued)

(52) U.S. Cl.
CPC ............. *H01L 35/34* (2013.01); *H01L 35/04* (2013.01); *H01L 35/08* (2013.01); *H01L 35/12* (2013.01); *H01L 35/16* (2013.01)

(58) Field of Classification Search
CPC .......... H01L 35/00; H01L 35/04; H01L 35/08; H01L 35/12; H01L 35/18
See application file for complete search history.

(56) References Cited

U.S. PATENT DOCUMENTS 3,201,504 A   8/1965 Stevens
3,269,871 A   8/1966 Bergstron et al.
(Continued)

FOREIGN PATENT DOCUMENTS

DE   102006039024 A1   2/2008
DE   102012205087 A1   2/2013
(Continued)

OTHER PUBLICATIONS

International Search Report; PCT/EP2014/067387; dated Oct. 8, 2014.
German Search Report; Sep. 18, 2014.

*Primary Examiner* — Savitr Mulpuri
(74) *Attorney, Agent, or Firm* — Michael Best & Friedrich LLP (57) ABSTRACT

The invention relates to a method for producing a thermoelectric component or at least one semi-finished product of same, in which a multiplicity of thermolegs made of a thermoelectrically active material are introduced into an essentially planar substrate made of an electrically and thermally insulating substrate material such that the thermolegs extend through the substrate essentially perpendicular to the substrate plane, and in which the active material is provided in pulverulent form, is pressed to give green bodies and is then sintered within the substrate to give thermolegs. It is based on the object of refining the method of the generic (Continued)

type mentioned in the introduction so as to increase the freedom of choice of the thermally and electrically insulating substrate material. The object is achieved in that the pulverulent active material is pressed, in a mould arranged outside the substrate, to give green bodies, the green bodies are pushed out of the mould and into holes provided in the substrate, where they are sintered to give thermolegs.

15 Claims, 5 Drawing Sheets (51) Int. Cl.
*H01L 35/04* (2006.01)
*H01L 35/08* (2006.01)
*H01L 35/12* (2006.01)

(56) References Cited

U.S. PATENT DOCUMENTS

| | | | | |
|---|---|---|---|---|
| 6,025,554 | A * | 2/2000 | Macris | H01L 35/10 136/200 |
| 6,127,619 | A * | 10/2000 | Xi | H01L 35/16 136/201 |
| 6,297,441 | B1 * | 10/2001 | Macris | H01L 35/32 136/201 |
| 6,872,879 | B1 | 3/2005 | Serras | |
| 8,378,206 | B2 | 2/2013 | Shutte et al. | |
| 8,388,883 | B2 * | 3/2013 | Stefan | C22C 1/0483 136/200 |
| 9,048,382 | B2 * | 6/2015 | Limbeck | H01L 35/26 |
| 9,105,781 | B2 * | 8/2015 | Hoppe | H01L 35/08 |
| 9,356,216 | B2 * | 5/2016 | Brueck | H01L 35/08 |
| 2005/0112872 | A1 * | 5/2005 | Okamura | H01L 35/32 438/666 |
| 2009/0039547 | A1 * | 2/2009 | Finnah | B22F 3/225 264/242 |
| 2010/0119770 | A1 * | 5/2010 | Hiroyama | H01L 35/32 428/131 |
| 2011/0018155 | A1 * | 1/2011 | Stefan | C22C 1/0483 264/13 |
| 2011/0023930 | A1 * | 2/2011 | Konig | H01L 35/34 136/212 |
| 2011/0314798 | A1 * | 12/2011 | Limbeck | F01N 5/025 60/320 |
| 2012/0177864 | A1 * | 7/2012 | Limbeck | H01L 35/26 428/66.6 |
| 2013/0019918 | A1 * | 1/2013 | Boukai | H01L 35/34 136/238 |
| 2013/0144107 | A1 | 6/2013 | Phillips et al. | |
| 2013/0160807 | A1 * | 6/2013 | Brueck | H01L 35/32 136/205 |
| 2013/0255740 | A1 * | 10/2013 | Delaizir | H01L 35/34 136/205 |
| 2013/0284228 | A1 * | 10/2013 | Toyoda | H01L 35/32 136/225 |
| 2014/0026934 | A1 * | 1/2014 | Xu | H01L 27/16 136/224 |
| 2014/0190543 | A1 * | 7/2014 | Chen | H01L 35/325 136/224 |
| 2014/0373888 | A1 * | 12/2014 | Boukai | H01L 35/34 136/200 |
| 2015/0047685 | A1 * | 2/2015 | Stenner | H01L 35/32 136/203 |
| 2015/0124343 | A1 | 5/2015 | Henderson et al. | |
| 2015/0144171 | A1 * | 5/2015 | Taniguchi | H01L 23/38 136/205 |

FOREIGN PATENT DOCUMENTS

| | | |
|---|---|---|
| DE | 102012205087 A1 | 10/2013 |
| EP | 0773592 A2 | 5/1997 |
| JP | 2004265988 A | 9/2004 |
| JP | 2006032850 A | 2/2006 |
| WO | 9963791 A2 | 12/1999 |
| WO | 02068245 A1 | 9/2002 |
| WO | 2008061823 A2 | 5/2008 |
| WO | 2011047405 A2 | 4/2011 |
| WO | 2013144107 | 10/2013 |
| WO | 2015124343 | 8/2015 |

* cited by examiner

METHOD FOR PRODUCING THERMOELECTRIC COMPONENTS BY POWDER METALLURGY

The invention relates to a method for producing a thermoelectric component or at least one semi-finished product of same, in which a multiplicity of thermolegs made of a thermoelectrically active active material are introduced into an essentially planar substrate made of an electrically and thermally insulating substrate material such that the thermolegs extend through the substrate essentially perpendicular to the substrate plane, and in which the active material is provided in pulverulent form, is pressed to give green bodies and is then sintered within the substrate to give thermolegs.

A thermoelectric component is an energy transducer which converts thermal energy to electrical energy, exploiting the thermoelectric effect described by Peltier and Seebeck. Since the thermoelectric effect is reversible, any thermoelectric component can also be used for conversion of electrical energy to thermal energy: elements known as Peltier elements are used for cooling or heating objects while consuming electrical power. Peltier elements are therefore also regarded as thermoelectric components in the context of the invention. Thermoelectric components, which serve for conversion of thermal energy to electrical energy, are often referred to as thermoelectric generators (TEGs).

Examples of and introductions to thermoelectric components can be found in:

Thermoelectrics Handbook-Macro to nano, D. M. Rowe (ed.), CRC—Taylor & Francis Group, Boca Raton, London, New York, 2006, ISBN 978-0-8493-2264-8

Thermoelectrics Goes Automotive, D. Jänsch (ed.), expert verlag GmbH, 2011, ISBN 978-3-8169-3064-8;

JP2006032850A;
EP0773592A2;
U.S. Pat. No. 6,872,879B1;
US20050112872A1;
JP2004265988A.

Industrial executions of thermoelectric components comprise at least one thermocouple of thermoelectrically active material, formed from two thermolegs, and a shell which bears and surrounds and electrically insulates the thermocouple from the outside.

The prior art describes a multitude of thermoelectrically active materials. Examples of suitable alloys for commercial use include those from the class of the semiconductive bismuth tellurides (especially with additional components of selenium and/or antimony), from which—with respective p-conductive doping and n-conductive doping—it is possible to form a thermocouple.

Further thermoelectrically active substance classes are: Semi-Heusler materials, various silicides (especially magnesium, iron), various tellurides (lead, tin, lanthanum, antimony, silver), various antimonides (zinc, cerium, iron, ytterbium, manganese, cobalt, bismuth; some are also referred to as Zintl phases), TAGS, silicon germanides, clathrates (especially based on germanium). As well as these semiconductor materials, thermoelectric components can also be produced from combinations of most standard metals, as is the case, for example, for conventional thermocouples for temperature measurement, e.g. Ni—CrNi. However, the figures of merit (thermoelectric "efficiencies") thus achievable are much lower than in the semiconductor materials mentioned.

Conventional thermoelectric components conventionally consist of solid blocks of thermoelectrically active semiconductors and hard, usually ceramic, electrically insulating casings. If solid blocks are used, they are sawn out of solid ingots. It is additionally known that thermoelectrically active material can be processed by means of powder metallurgy, in order again to obtain in one sintering step very substantially impervious blocks with a low level of cavities, from which blocks cuboidal TE legs are in turn sawn out as required.

This prior art discloses pressing the active material in pulverulent form through a perforated template, such that green bodies in the form of tablets are obtained. This template is a solid mould from the tableting apparatus. The thermoelectric green bodies pressed through the template are then sintered, possibly as required sawn to size, polished and/or coated, arranged in a suitable manner with the aid of perforated grids and electrically connected to one another via solder bridges, the grid is removed again, remaining contact bridges are applied, and the semi-finished version of the thermoelectric component thus obtained is finally completed with two top sheets of, in particular, ceramic materials and optionally a lateral seal (for example by means of silicone sealing compounds) to form the ready-to-use module.

WO 2008061823 A1 discloses production of a semi-finished version of a thermoelectric component by introducing thermoelectric material as a powder into a flat porous substrate. The thermolegs of the component produced extend perpendicular to the substrate plane.

A method of the generic type mentioned in the introduction is known to the inventors from DE102012205087A1, not published at the time of the application. Pressing of the active material provided in pulverulent form takes place within the holes of a perforated template, which becomes part of the produced thermoelectric component, namely the substrate.

The drawback of this method can be considered to be that this template must necessarily consist of a thermally and electrically insulating material since it remains in the TEG as substrate. At the same time, the template must withstand high mechanical loads during pressing of the green bodies, which restricts the choice of the thermally and electrically insulating substrate material.

Proceeding from this prior art, the invention is based on the object of refining the method of the generic type mentioned in the introduction so as to increase the freedom of choice of the thermally and electrically insulating substrate material.

The object is achieved in that the pulverulent active material is pressed, in a mould arranged outside the substrate, to give green bodies, the green bodies are pushed out of the mould and into holes provided in the substrate, where they are sintered to give thermolegs.

The invention therefore relates to a method for producing a thermoelectric component or at least one semi-finished product of same, in which a multiplicity of thermolegs made of a thermoelectrically active active material are introduced into an essentially planar substrate made of an electrically and thermally insulating substrate material such that the thermolegs extend through the substrate essentially perpendicular to the substrate plane, and in which the active material is provided in pulverulent form, is pressed to give green bodies and is then sintered within the substrate to give thermolegs, wherein the pulverulent active material is pressed, in a mould arranged outside the substrate, to give green bodies, the green bodies are pushed out of the mould and into holes provided in the substrate, where they are sintered to give thermolegs.

The invention is based on the idea of pressing the powder ex situ, namely in a special mould outside the substrate, to give green bodies and then pushing the green bodies into holes provided for that purpose in the substrate.

With regard to the in situ pressing carried out in DE102012205087A1, this procedure has the decisive advantage that the mould no longer has a role to play within the subsequent TEG and therefore need not also consist of an insulating material. It is thus possible, in the simplest case, for the mould to be made of steel, which has superb capacities for withstanding the forces arising during pressing of the green bodies. At the same time, the substrate can consist of a thermally and electrically insulating material which has only relatively low mechanical strength, since the forces which arise when pushing the green bodies into the substrate are markedly lower than those which arise when pressing the powder. This substantially broadens the freedom of choice of the optimal substrate material for the functioning of the thermoelectric component.

The method according to the invention not only opens up advantages with respect to the product to be produced, but also permits processing advantages:

Thus, one preferred embodiment of the invention provides using the same tools for pressing the pulverulent active material to give the green bodies and for pushing these green bodies into the holes in the substrate. Tools for pressing are namely not designed only to exert pressure on the material but also to move the material. The multifunctional use of the tools rationalizes the production process. The pressing force required for pressing the active material is approximately 10 times to 100 times greater than the force required for pushing the green body into the substrate.

Preferably, the tools are at least one pair of punches which are inserted from both sides into the mould and of which one engages through the hole provided in the substrate for the respective green body. Such an arrangement is particularly simple to implement in terms of process technology.

A further preferred embodiment of the method according to the invention provides that a plurality of moulds are combined to give a planar template, and in that, at least during pressing of the active material and insertion of the green bodies, the template lies areally on the substrate such that holes and moulds are in line with each other. Combining multiple moulds to give a template makes it possible to reduce cycle times since it is possible to simultaneously fill multiple moulds with powder, press green bodies therein and then push the latter into the substrate. This makes the process markedly quicker and more efficient. In that context, the moulds are preferably combined to give a planar template lying areally on the substrate, such that the template can fix the substrate during insertion. More of that later. In order to make it possible for one of the punches to engage through the substrate into the moulds, holes and moulds should be in line with one another. Preferably, the number of moulds combined to give the template corresponds to the number of holes in the substrate. It is therefore possible to fill the entire substrate from the template in one operation. Alternatively, it is possible to combine a smaller number of moulds, for example to give a template strip, and to fill the substrate with green bodies in multiple passes.

The holes in the substrate are preferably in the form of circular cylinders and created as through-holes. Circular-cylindrical through-holes are namely particularly simple to introduce into the substrate. Accordingly, the mould should also be formed as a circular cylinder, specifically with essentially the same diameter as the holes, since the green body is already pressed to very nearly the dimensions of the subsequent thermoleg. Namely, the mould then simultaneously serves for calibrating the green body.

Prior to pressing the green bodies into the substrate, the latter must be provided with suitable holes into which the green bodies are pushed. The holes are preferably created with a chip-removing production process such as for example drilling or milling. Drilling has proven to be particularly advantageous since the hole can be drilled directly to its final dimension. In the event that the precision of the drilling or the surface quality of the drilled hole wall is not sufficient, the wall can also be reamed. In any case, it is advisable to drill dry, i.e. without the aid of cooling lubricants. This is counterintuitive since the substrate material to be drilled is thermally insulating and hence permits only limited heat dispersal, which suggests the addition of cooling lubricants. However, it has surprisingly been found that the wall of the substrate material is less damaged without the use of a cooling lubricant and accordingly the green body, and subsequently the thermoleg generated therefrom, remains better fixed in the hole provided therefor.

The adhesion and the seating of the green body or of the thermoleg in the hole can be significantly improved by the holes being blown clean during and immediately after the chip-removing machining, in order to effectively evacuate removed material. However, for blowing clean, use is not made of conventional compressed air but rather an inert gas which is substantially free from oxygen, carbon dioxide and water vapour. Most suitable for blowing the holes clean is dry nitrogen. The reason for using inert gas is the sensitivity of many thermoelectric active materials with respect to oxidation.

It is important that the substrate is held on both sides by planar clamping means during introduction of the holes, and specifically at least in the region of the holes to be introduced, but in the best case areally. The reason for this is that many substrate materials, in particular those which are constructed as laminates, can splinter, tear or delaminate during drilling. This must absolutely be avoided since otherwise the seating of the legs in the substrate is impaired and any cracks in the substrate can propagate and can lead to breakage of the thermoelectric component. However, if the substrate is gripped on both sides by clamping means and is subjected to a slight pressure, this markedly reduces the risk of such damage arising. In addition, markedly better surface quality of the sides of the drilled holes are achieved in comparison to without clamping.

A suitable pressure to which the clamping means should subject the substrate is in the range from 20 kPa to 100 kPa.

In particular when the clamping means lie areally on the substrate, it is expedient for at least one of the two clamping means to have holes through which the drill reaches when drilling the holes. It makes no sense to drill into the clamping means using the drill. In addition, the clamping means provided with the holes can at the same time be used as a template after introduction of the holes. This makes the process substantially more efficient since re-clamping is dispensed with.

Fundamentally, the method according to the invention makes it possible to choose from a broad range of possible substrate materials. In order to increase the efficiency of the thermoelectric generator, the chosen substrate material should, in so far as is possible, be highly thermally and electrically insulating. However, the substrate material must also be available cost-effectively in order to ensure economic viability. Furthermore, the substrate material must have a temperature resistance which is suitable for the further production path and the subsequent use in the thermoelectric component. Examples of particularly economically advantageous substrate materials are composite materials constructed from inorganic raw materials and binders. The inorganic raw materials are preferably mica, perlite, phlogopite or muscovite. As binder, use is preferably made of silicone or silicone resin. With these materials, it is in particular possible to laminate substrates constructed as layered materials. Most suitable as substrate are the insulating platens available under the trade names Miglasil® and Pamitherm® from von Roll AG. These are laminates constructed from silicone-bound muscovites. This temperature-stable insulation material has outstanding machining properties in the inventive process, despite being mechanically relatively fragile. The laminated form is particularly susceptible to cracks which arise in the event of introduction not according to the invention.

When using laminated substrate materials made of inorganic raw materials and binders, it is important to observe suitable machine parameters during mechanical machining in order to avoid damage to the material. Thus, during chip-removing piercing of Pamitherm platens using solid carbide drills, a cutting speed in the range from 0.3 m/s to 1.5 m/s should be observed. In the case of a drill diameter of 4 mm, this implies rotational speeds of approximately 1500 to 7500 rpm. The feed should be in the range from 50 to 250 mm/min. Use can also be made of drills and milling drills developed specially for laminates.

The substrate is used as a planar material with a thickness between 1 and 10 mm. The thickness is preferably between 1.5 and 4 mm, very particularly preferably between 2 and 3 mm. Pamitherm® platens are available in this thickness.

For every thermocouple, two different conductive thermoelectric active materials are needed in each case, and these are electrically connected to one another, the first active material, for example, being p-conductive and the second active material n-conductive, or vice versa. "Different" means here that the two active materials have a different Seebeck coefficient. p- and n-conductive semiconductors are particularly preferred as active materials, since the Seebeck coefficients thereof have different signs (negative for n-conductors, positive for p-conductors), and therefore the numerical difference in the Seebeck coefficients is particularly large. This increases the efficiency of the thermoelectric component.

Preferably, in the method according to the invention, the two active materials are pressed simultaneously to give the respective green bodies.

In principle, any thermoelectric active material can be used according to the invention, provided that it can be worked in a powder-metallurgical manner. These are in particular alloys from the class of bismuth tellurides, zinc antimonides, silicides and semi-Heusler materials.

The particle size distribution of the active material is of particular importance for pressing and for the sintering procedure. It is determined by means of laser diffraction. Accordingly, the average particle size $d_{50}$ of the active material is between 1 and 50 μm. Although the powder, at this particle size, does exhibit fluidic behaviour during compaction and largely converts the forces applied by the punches during pressing into transverse forces that act on the mould, this is not significant in the context of the present invention since the mould can consist of a stable material such as steel which withstands the transverse forces.

The average particle size in the range between 1 and 50 μm is therefore advantageous since the active material can still be ground to this particle size with relatively low energy input: the finer the material, the more energy-intensive it is to grind. In this context, it has been shown that an average particle size between 1 and 50 μm achieves an exceptional compromise between the energy requirement for producing the powder and the quality of the sintered legs. The energy requirement of the grinding process can be lowered by grinding at a maximum temperature between 30° C. and 50° C. This also subjects the grinding stock to less thermal load, which is beneficial for the thermoelectric figures of merit.

After the mould has been filled with the pulverulent active material, this material is preferably acted on with vibration. In the simplest case, this is effected by vibration excitation of the mould, at frequencies of 5 to 50 Hz and displacement amplitudes of up to 0.1 mm over a time period of 1 to 5 seconds. Alternatively, the powder can be acted upon by vibration by means of an immersed needle (diameter<1 mm), wherein the needle should be immersed centrally in line with the hole until an immersion depth in the powder of at least 90% is reached, the frequencies should be up to 1000 Hz at maximum needle tip displacements (without the surrounding powder) of 0.5 mm and a vibration duration of 1 to 5 seconds. The needle must then be withdrawn from the powder with continued vibration. The vibration causes the powder mixture to settle such that, during pressing, no sudden volume changes arise, which could be associated with damage to the green body.

The pressing pressure for pressing the pulverulent active material to give the green bodies is dependent on the chosen material and on the particle size distribution. Bismuth tellurides having an average particle size between 1 and 50 μm are preferably pressed to green bodies at a pressure of 500 to 5000 MPa, resulting in an average density of the green bodies of at least 90% of the density of the solid starting material (ingot).

After the green bodies have been introduced into the substrate, they are sintered therein. This is for example effected by means of electrical current sintering methods, i.e. by passing through electrical current and consequent heating of the structure of the active material. In that context, spark plasma sintering (SPS) is the most preferred electrical current sintering method, and is described extensively in the relevant literature. During electrical current sintering, the punch pair which is used for pushing the green bodies into the substrate can be used as the electrode pair. The sintering process (i.e. the electric current flow) can thus start even during compaction in the mould, provided however that the mould is not electrically conductive. For this reason, sintering is preferably carried out within the electrically insulating substrate. In so far as the punches are simultaneously used as electrodes, it is also possible to use the punches to apply an additional pressure to the green body during the sintering process, which pressure is however lower than during the preceding cold pressing of the green body.

Preferably, however, use is not made of an electrical current sintering method but rather of a thermal method in a conventional oven process:

To that end, the substrate, with introduced green bodies, is placed for sintering into an autoclave in which the sintering process takes place at elevated pressure and elevated temperature in an inert atmosphere. In this context, an inert atmosphere is to be understood as a gas mixture which fills the autoclave and is as far as possible free from oxygen, carbon dioxide, water vapour and other oxidizing substances, since these substances, in particular at high temperature and pressure, might oxidize the active material. This can be prevented by using, as the inert oven atmosphere, nitrogen or argon (purity respectively at least 4.0, but preferably 5.0). The hydrostatic pressure exerted by the oven atmosphere on the workpiece is preferably to be chosen so as to be lower than the pressure exerted on the pulverulent active material during cold pressing of the green bodies. This measure is due to the fact that, otherwise, there is a risk of damage to the workpiece, in particular to the substrate material, in the autoclave.

If for example bismuth telluride is to be sintered in a Pamitherm® substrate, the following conditions in the autoclave are chosen:

Nitrogen (purity 5.0), oven temperature 250-330° C., maximum pressure 5-30 MPa, residence time at maximum pressure 10 s to 10 min.

A particular advantage of the thermal sintering process is that the thermoelectric component is subjected to lower mechanical loads than is the case in the other sintering methods. This is advantageous especially when using sensitive substrate materials.

Furthermore, this thermal sintering process is also economically advantageous with respect to electrical current sintering processes. This is due to the fact that a multiplicity of substrates equipped with green bodies can simultaneously undergo the autoclave process. The pressing process is thus decoupled in terms of process technology. In the majority of electrical current sintering methods, it is necessary, during the sintering process, for a mechanical pressure to be simultaneously exerted on the sintered body. This requires that the sintering process take place still inside the actual pressing tool or inside a similar, downstream tool. Such sintering processes are characterized by relatively long residence times, i.e. long cycle times, and thus low throughput for each sintering tool, while the upstream powder filling and pressing procedure is usually characterized by short cycle times (in the region of seconds). At the same time, tools for exerting high compressive forces are generally expensive and result in high running energy costs. Sintering in such a pressing tool is therefore economically disadvantageous since it gives rise to high investment and operating costs at low throughput.

In terms of process technology, the sintering process can be carried out most simply as a batch process, while drilling and pressing can be embodied as a cyclically continuous process. In order to link the two process steps, it is as already mentioned advantageous to gather a multiplicity of substrate platens with inserted green bodies on a pallet and to place this into the autoclave. An advantageous collective sintering then takes place herein.

At the end of the sintering process there is a semi-finished version of a thermoelectric component which consists of the insulating substrate with thermolegs inserted therein. In order to construct a functional thermoelectric generator therefrom, it is necessary that electrical contacts should be formed in a suitable manner, at least on one side of the substrate, between the active material sintered in the holes, for example by soldering. Soldering together the individual thermolegs forms the thermoelectrically active thermocouples. In addition, a multitude of thermocouples within the thermoelectric component may be connected to one another in parallel and/or in series, in order to increase the output or voltage of the TEG. The connection of the thermolegs or thermocouples is preferably effected by known soldering methodology.

When soldering, however, it should be noted that constituents of the solder such as for example tin, silver or lead can diffuse significantly into the active materials, which can have a lasting adverse effect on the performance of the thermoelectric component. In order to prevent this, a diffusion barrier should be provided between the active material and the solder. A suitable diffusion barrier is especially a layer of nickel, tungsten, molybdenum or carbon polymorphs, alone or mixtures thereof. Such a diffusion barrier can be deposited for example by sputtering, by chemical vapour deposition or by powder plasma spraying. In the course of the method according to the invention, it is also conceivable to apply the diffusion barrier in a deforming manner:

According to this idea, the template is used as a die and a foil of barrier material, for example of nickel, is laid over the template. The punch then moves against the foil and, at the cutting edge of the die, stamps a disc out of the foil and presses it as diffusion barrier onto the active material. This combined pressing/stamping method for applying the diffusion barrier onto the green bodies must necessarily be carried out prior to pressing.

Applying the diffusion barrier with the aid of a coating method can however be carried out after the green bodies have been pushed into the substrate or even only after the sintering procedure.

Soldering the thermolegs together to give thermocouples and possibly connecting the thermocouples can be carried out after sintering but also during sintering since the sintering temperatures are generally higher than the melting points of commonly used solders.

Instead of conventional soldering technology, it is also possible to use a flame spraying method for creating contacts between the thermocouples. A suitable flame spraying method is known from WO02068245A1. It is equally possible to use thermal spraying in accordance with DIN32530.

DESCRIPTION OF FIGURES

The present invention will now be explained in more detail on the basis of exemplary embodiments. The figures show, in schematic form.

Figure 1:
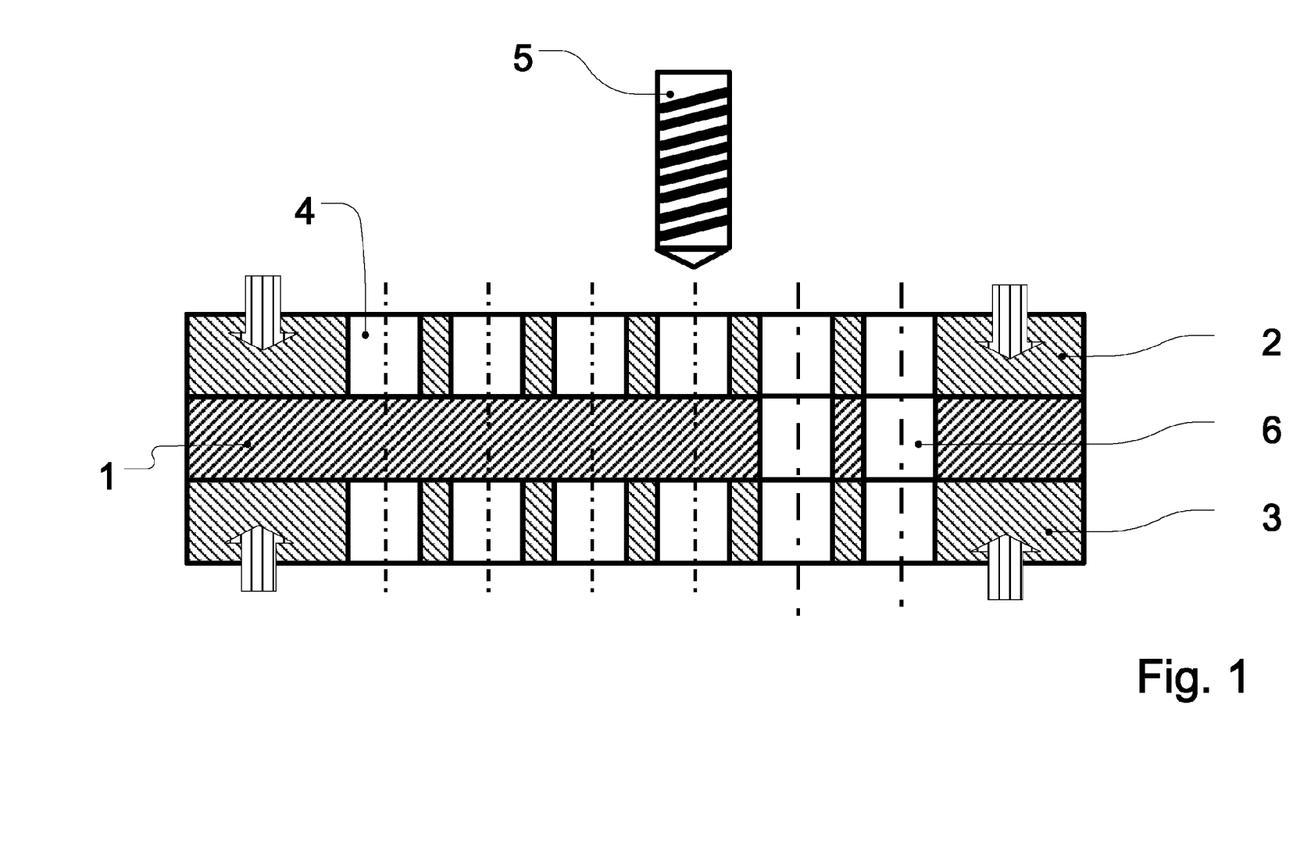
FIG. 1: drilling through the substrate.

An essentially planar substrate 1 in the form of a platen made of an electrically and thermally insulating substrate material is placed between two clamping means 2, 3 and is clamped areally therebetween. The clamping means 2, 3 are made of steel and are provided with a multiplicity of holes 4, wherein the holes in the upper clamping means 2 are aligned with those in the lower clamping means 3. A drill 5 enters through the holes 4 in the upper clamping means 2 and drills through-holes 6 in the substrate 1. During drilling, a clamping force is exerted by the clamping means 2, 3 on both sides of the substrate 1 in order to prevent breakup of the holes 6.

Figure 2:
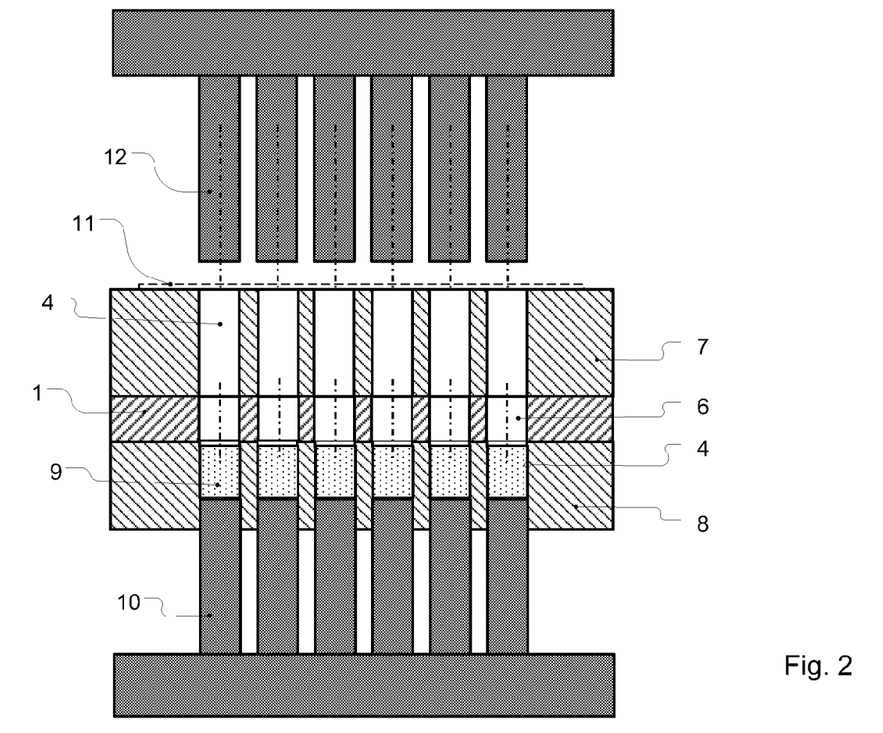
FIG. 2: preparing the pulverulent active material within the mould.

The pierced substrate 1 is then clamped between two templates 7, 8, see FIG. 2. The two templates 7, 8 are also provided with holes 4 which are aligned with the holes 6 in the substrate 1. The templates 7, 8 can be, but are not necessarily, identical to the clamping means 2, 3. The planar templates 7, 8 are made of steel, lie areally on the substrate 1 and exert a clamping force on the substrate 1. The holes 4 in the lower template 8 serve as a mould for receiving pulverulent thermoelectric active material 9. To that end, the holes must be closed on their lower side. To that end, in each case a lower punch 10 is moved into the holes 4 of the lower template 8 such that there results a cavity which is open only in the direction of the substrate 1, which cavity is filled from above with pulverulent active material 9. Two sorts of active material are introduced in alternation, corresponding to the subsequent n-legs and p-legs. In the drawing, no distinction is made here between the two sorts of active material.

In addition, a foil 11 of a barrier material such as nickel can be placed over the upper template 7. A multiplicity of upper punches 12 are combined to give a pressing tool.

Figure 3:
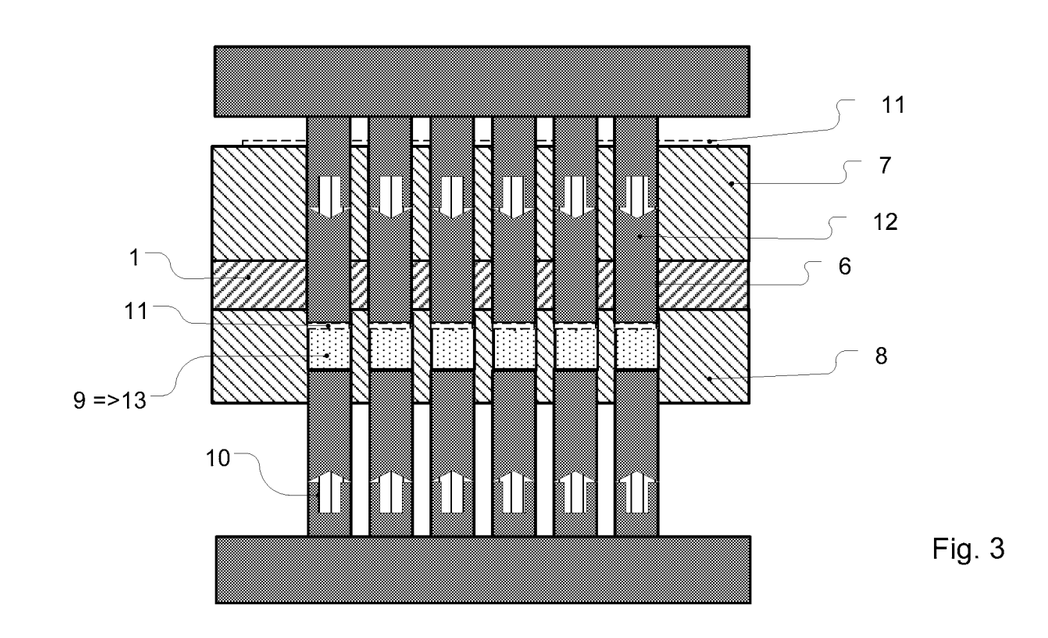
FIG. 3: pressing the powder to give green bodies.

As shown in FIG. 3, the pressing tool with the upper punches 12 is moved downwards such that the upper punches 12 reach through the upper template 7 and the holes 6 in the substrate 1. When plunging into the upper template 7, the upper punches 12 stamp out, at the cutting edge of the upper template 7 serving as a die, a round of barrier material from the foil 11 and press it against the active material 9. In similar fashion, it is possible for a round of barrier material to be pressed against the pulverulent material from below, in order to also cover the underside with barrier material. This is however not shown in the drawings.

Where necessary, the pulverulent active material 9 can be acted upon with vibration within the lower template 8. This is effected by vibrating the lower template 8 or the lower punch 10 or by means of a vibrating needle (not shown) plunged into the powder fill from above. The introduced vibration causes the active material to settle.

The pulverulent active material 9 is now pressed within the lower template 8 to give green bodies 13. The transverse forces resulting therefrom are absorbed by the lower template 8. Pressing is effected by loading the punch pairs 10, 12 via the respective pressing tools.

Figure 4:
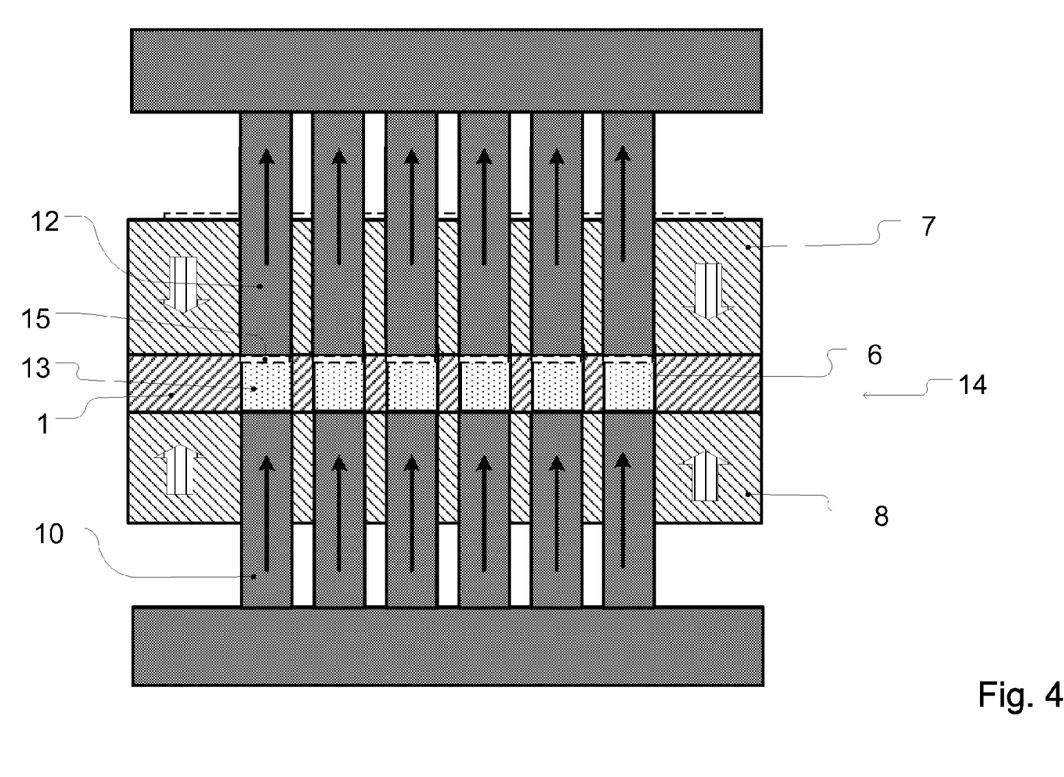
FIG. 4: pushing the green bodies into the holes in the substrate.

The pressing tools 10, 12 then move upwards such that the lower punches 10 push the green bodies 13 into the holes 6 in the substrate 1 (FIG. 4). In that context, the upper punch 12 withdraws at the same speed as the lower punch 10 advances in order that the green bodies 13 move into the substrate 1 without being destroyed. In the process, the templates 7, 8 exert a pressure on the substrate 1.

Once the green bodies 13 have arrived at their intended place, the punches 12 and 10 withdraw from the templates 7 and 8, the templates 7, 8 move apart and a semi-finished version 14, comprising the substrate 1 with the inserted green bodies 13 and, where relevant, the applied diffusion barriers 15, demoulds.

The production process has up to this point been carried out as far as possible as a cyclical, continuous process. In order to sinter the green bodies 13, these are gathered on a pallet 16 and are placed into an autoclave 17; see FIG. 5. There, the semi-finished versions 14 are subjected to a thermal sintering process at elevated atmospheric pressure and elevated temperature. In the process, the green bodies 13 sinter to form finished thermolegs 18.

Figure 5:
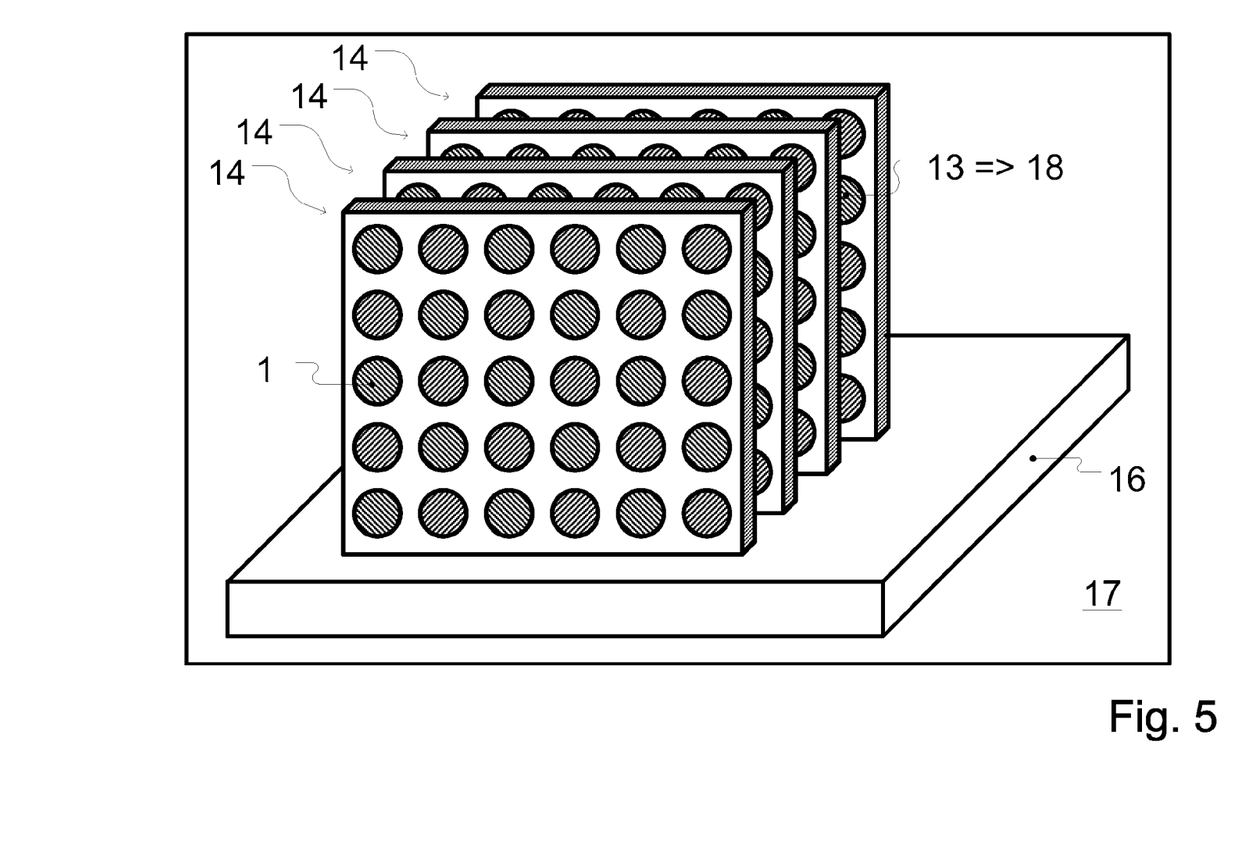
FIG. 5: substrates with green bodies in the autoclave.

After the end of the sintering process, the individual thermolegs 18 must still be connected to form thermocouples. This is carried out for example using a soldering process which is known per se and which will not be discussed further here. Connecting the thermolegs 18 to form thermocouples and possibly connecting the thermocouples to one another produces a functional thermoelectric component.

EXAMPLE

First, suitable semiconductor powders (n-and p-doped) must be produced. Table 1 shows the composition of the ingots used as starting material.

TABLE 1

Composition of the starting materials

| Elements | p-type wt % | n-type wt % |
|---|---|---|
| Sum Be . . . Fe | 0.16 | — |
| 34 + Se | — | 2.64 |
| 51 + Sb | 26.88 | — |
| 52 + Te | 56.68 | 43.12 |
| Sum La . . . Lu | 0.12 | 0.27 |
| 83 + Bi | 16.38 | 54.23 |

The compositions have been determined by means of semi-XRF analysis (maximum relative deviation +/−5%)

In that context, the grinding procedure is as follows for all of the above-mentioned semiconductor materials:

Inerting: All work performed under nitrogen (5.0) in a glovebox

Mill: Fritsch Pulverisette 6 classic line

Grinding container: Zirconium oxide, gas-tight closure

Grinding media: 20 balls (diameter 2 cm) made of zirconium oxide

Speed: 650 rpm

Powder filling: 225 cm$^3$ (coarsely broken, d50<5 mm)

Sequence: 10 grinding periods of 10 min each, 60 min pause inbetween for cooling (in order to limit the thermal load on the grinding stock)

Analysis: Particle size distribution using HORIBA 920-L, powder using ultrasound dispersed in demineralized water, maximum pump circulation rate Target value: d50<8 μm (otherwise further grinding periods).

A 51 mm square is sawn from 2 mm-thick Pamitherm®.

This substrate is placed between two clamping means (steel block 51×51×15 mm) and is secured therebetween with a clamping pressure of 20 kPa. The clamping means have a multiplicity of holes of diameter 4.1 mm, with a minimum lateral distance of 1.9 mm between any two holes. The holes in both clamping means are in each case identically placed and are thus aligned with one another.

Now, a drill is passed through each of the holes of the first clamping means, creating a through-hole in the substrate, in line with the holes in the two clamping means. The drill diameter is 4 mm, rate of advance 200 mm/min, speed 1600 rpm, drill type: solid carbide drill product "Miller Mega-Drill-Inox, shank form HA, MxF-coated, type M1703-0400AE".

The substrate thus obtained is secured between two clamping means similar to those first mentioned. The only difference with respect to the first clamping means is that here the through-holes have a nominal diameter of 4 mm, identical to the holes in the substrate.

This sandwich is secured in a hydraulic press acting on both sides. This press has two hydraulic punches with a nominal diameter of 4 mm and a length of 30 mm which lie on the same vertical central axis. Both punches can be moved independently of one another on this central axis, the punch faces being opposite one another. In that context, one punch acts from below while the other acts from above. The two punches, and the holes in the two clamping means, are produced in accordance with DIN 7157, with a H7/g6 fit with respect to one another (or possibly alternatively: H8/h9).

The lower punch is moved upwards through a hole in the lower clamping means until its upper side is still at a distance of 6 mm from the substrate.

This hole in the upper clamping means is then filled from above with a quantity of 0.186 g of the ground bismuth telluride powder (n-doped). A vibrating needle (diameter 0.5 mm, length 100 mm) is now inserted from above into the powder fill and is vibrated for 1 second (frequency 100 Hz, amplitude at the free needle tip 0.5 mm). This settles and homogenizes the powder fill.

The upper punch is now moved from above into this hole (rate of advance 1 mm/s) until between the two punches a green body of height 2 mm (tolerance +/−0.1 mm) is generated and a pressure of approximately 830 MPa is reached. The punches remain in this position for 5 seconds.

Then, both punches move synchronously with a rate of advance of 1 mm/s in the opposite direction such that the green body is pushed upwards into the substrate, the pressing force acting on the green body being essentially maintained but in no circumstances increased. The green body is now embedded in the substrate and its upper and lower sides are essentially flush with the two surfaces of the substrate.

The two punches now withdraw completely from the substrate and the clamping means.

An analogous procedure is now used to produce all of the other n-legs in the substrate (half of all the holes in the substrate). Then, the same procedure is repeated for the p-legs such that, in the end, all of the holes in the substrate are filled with green bodies made of n- or p-doped bismuth telluride. The only differences in the case of the p-legs are the mass of powder used for each green body (0.162 g) and the maximum pressing force (approximately 800 MPa).

The filled substrate is now placed into a glovebox, flushed with nitrogen 5.0 and a residual oxygen content of <100 ppm. In this glovebox there is an autoclave which is preheated to a surface temperature of the internal wall of 290° C. The filled substrate is now placed into this autoclave. The interior of the autoclave is also flushed with nitrogen 5.0 (at least 20 complete gas exchanges per hour). The pressure in the autoclave is now raised to 90 bar=9 MPa within 2 minutes, after which the gas temperature inside the autoclave rises to 285-290° C. within a further 3 minutes. This pressure and this temperature are maintained for 5 minutes. Then, the pressure is reduced to normal pressure within 1 minute, the now-sintered semi-finished product is removed and is left in the glovebox to cool to room temperature.

Subsequently, the operational steps required for completing a TE-component can be carried out on the sintered semi-finished product:

Cleaning the end faces of the TE-legs (polishing, plasma treatment or the like)
Applying diffusion barriers (e.g. nickel by means of atmospheric pressure plasma coating)
Applying contact-promoting layers (e.g. tin by means of atmospheric pressure plasma coating)
Soldering with contact bridges
Applying casing layers

LIST OF REFERENCE NUMERALS 1 substrate
2 upper clamping means
3 lower clamping means
4 holes
5 drill
6 hole
7 upper template
8 lower template
9 pulverulent active material
10 lower punch
11 foil
12 upper punch
13 green body
14 semi-finished product
15 diffusion barrier
16 pallet
17 autoclave
18 thermoleg

What is claimed is:

1. A method for producing a thermoelectric component or at least one semi-finished product of same, in which a multiplicity of thermolegs made of a thermoelectrically active active material are introduced into an essentially planar substrate made of an electrically and thermally insulating substrate material such that the thermolegs extend through the substrate essentially perpendicular to the substrate plane, and in which the active material is provided in pulverulent form, is pressed to give green bodies and is then sintered within the substrate to give thermolegs, characterized in that the pulverulent active material is pressed, in a mould arranged outside the substrate, to give green bodies, the green bodies are pushed out of the mould and into holes provided in the substrate, where they are sintered to give thermolegs.

2. The method according to claim 1, characterized in that pressing the pulverulent active material to give green bodies and pushing the green bodies into the holes in the substrate is performed with the aid of the same tools.

3. The method according to claim 2, characterized in that the tools are at least one pair of punches which are inserted from both sides into the mould and of which one engages through the hole provided in the substrate for the respective green body.

4. The method according to claim 3, characterized in that a plurality of moulds are combined to give a planar template, and in that, at least during pressing of the active material and insertion of the green bodies, the template lies areally on the substrate such that holes and moulds are in line with each other.

5. The method according to claim 1, wherein the holes and the mould are of circular cylindrical shape and have essentially the same diameter.

6. The method according to claim 1, wherein the holes are introduced into the substrate in a chip-removing manner, in particular by drilling and without the aid of cooling lubricants.

7. The method according to claim 6, wherein the holes are blown clean after chip-removing machining, in particular using an inert gas.

8. The method according to claim 6, wherein the substrate is held on both sides, in particular a really, by planar clamping means during introduction of the holes.

9. The method according to claim 4, wherein one of the two clamping means is used as a template after introduction of the holes.

10. The method according to any claim 1, wherein the substrate material is a composite material made of inorganic raw materials and binders.

11. The method according to claim 10, wherein the composite material is constructed as a laminate, in that the inorganic raw materials are selected from the group comprising mica, perlite, phlogopite, muscovite and in that the binders are silicone or silicone resin.

12. The method according to claim 10, wherein the thickness of the substrate is between 1 and 10 mm, preferably that it is between 1.5 and 4 mm and very preferably that the thickness is between 2 and 3 mm.

13. The method according to claim 1, wherein the active material is an alloy which is chosen from the class of bismuth tellurides, zinc antimonides, silicides, semi-Heusler materials, and in that the particle size distribution—determined by means of laser diffraction methods—of the active material has an average particle size $d_{50}$ of between 1 and 50 µm, and in that, to set this particle size distribution, the active material is ground at a maximum temperature of between 30° C. and 50° C.

14. The method according to claim 1, wherein the pulverulent active material is acted upon with vibration within the mould prior to pressing.

15. The method according to claims 1, wherein the substrate, with introduced green bodies, is placed for sintering into an autoclave in which the sintering process takes place at elevated pressure and elevated temperature in an inert atmosphere, wherein in particular the gas pressure within the autoclave is lower than the pressure exerted on the pulverulent active material during pressing of the green bodies.

\* \* \* \* \*